United States Patent [19]
Kishi

[11] Patent Number: 5,972,766
[45] Date of Patent: Oct. 26, 1999

[54] METHOD OF MANUFACTURING A BIPOLAR TRANSISTOR BY USING ONLY TWO MASK LAYERS

[75] Inventor: Shuuji Kishi, Tokyo, Japan

[73] Assignee: NEC Corporation, Tokyo, Japan

[21] Appl. No.: 08/808,168

[22] Filed: Feb. 28, 1997

[30] Foreign Application Priority Data

Feb. 28, 1996 [JP] Japan .................................. 8-041153

[51] Int. Cl.⁶ ..................... H01L 21/331; H01L 21/8238; H01L 21/8222
[52] U.S. Cl. ......................... 438/309; 438/202; 438/203; 438/365; 438/370
[58] Field of Search .................................. 438/309, 365, 438/549, 532, 370, 202, 203

[56] References Cited

U.S. PATENT DOCUMENTS

| | | | |
|---|---|---|---|
| 4,498,227 | 2/1985 | Howell et al. | 29/576 B |
| 5,516,718 | 5/1996 | Lee | 437/59 |
| 5,571,731 | 11/1996 | Grutzediek et al. | 437/31 |
| 5,648,279 | 7/1997 | Imai | 437/31 |
| 5,866,462 | 2/1999 | Tsai et al. | 438/366 |

FOREIGN PATENT DOCUMENTS

| | | |
|---|---|---|
| 62-155554 | 7/1987 | Japan . |
| 63-164458 | 7/1988 | Japan . |
| 63-284854 | 11/1988 | Japan . |
| 4-226034 | 8/1992 | Japan . |

OTHER PUBLICATIONS

Havemann, Robert H. and Robert H. Eklund. "Process Integration Issues for Submicron BiCMOS Technology," Solid State Technology, Jun. 1992, p. 71–76.

R.H. Havemann et al., "Subjects related to Process Integration for Submicron BICMOS Technique", *solid state technology*, Japanese edition Aug. 1992, pp. 13–19.

*Primary Examiner*—Charles Bowers
*Assistant Examiner*—Sam Lee
*Attorney, Agent, or Firm*—Young & Thompson

[57] ABSTRACT

A method of manufacturing a transistor capable of obtaining a BICMOS while making the difference in the number of manufacturing processes from a CMOS smaller, includes the steps of: separating an element region in a semiconductor substrate; forming a emitter opening for deciding upon an emitter layer in an insulating film on the semiconductor substrate, forming a polysilicon film on the insulating film and in the emitter opening; implanting selectively impurity ions into the semiconductor substrate through the polysilicon film and the insulating film to form: a collector layer and a base layer; and performing heat treatment for activating impurities in the base layer and the collector layer and diffusing impurities into the semiconductor substrate from the polysilicon film to form an emitter diffused layer.

3 Claims, 5 Drawing Sheets

METHOD OF MANUFACTURING A BIPOLAR TRANSISTOR BY USING ONLY TWO MASK LAYERS

BACKGROUND OF THE INVENTION

1. Field of the Invention

The present invention relates to a method of manufacturing a semiconductor device and, more particularly, to a method of manufacturing a bipolar (BIP) transistor capable of being incorporated with complementary metal oxide semiconductor (CMOS) transistors on a single semiconductor substrate.

2. Description of the Related Art

A semiconductor device having a BIP transistor and CMOS transistors is called a BiCMOS device and presents excellent device characteristics by utilizing an advantage of low power consumption and high integration density of the CMOS transistors and a low noise and a high driving capacity of the BIP transistor. However, a device structure of the BiCMOS device and a manufacturing method of the same are relatively complicated, thereby requiring a relatively large chip area and deteriorating device characteristics.

This will be discussed in detail below with reference to FIG. 2 illustrating a method of manufacturing a BiCMOS device according to the prior art as disclosed in, for example, "Subjects related to Process Integration for Submicron BICMOS Technique" (solid state technology/Japanese edition August 1992).

As shown in FIG. 2A, such a P-type silicon substrate 1 is prepared that has an nMOS section (a), a pMOS section (b), an isolation region section (c) and an BIP section (d). $N^+$ buried layers 2 are formed in the pMOS, section (b) and the BIP section (d), and $P^+$ buried layers 3 are formed in the nMOS section (a) and an isolation region section (c).

As shown in FIG. 2B, thereafter, an intrinsic epitaxial layer 4 is grown on the whole surfaces of the silicon substrate 1, followed by selectively forming P-well regions 5 and N-well regions 6 in the layer 4. The respective well regions 5 and 6 are formed in contact with corresponding ones of the burried regions 2 and 3.

Selectively formed in the layer 4 are, as shown in FIG. 2(C), field oxide films 7 in order to separate element regions by a selective thermal oxidation known as LOCOS (local oxidation of silicon) method. A P-type base layer 8 is then selectively formed in the well region 6 serving as a collector region. An $N^+$ type collector contact region layer 9 is thereafter formed so as to reach the N buried layer 2. Thereafter, a gate oxide film 10 is formed over an entire surface.

The gate oxide film 10 is covered with a polysilicon film 11 as shown in FIG. 2D, followed by an emitter opening 13 is selectively formed to expose a part of the base region 8.

Another polysilicon film 12 is then deposited on the whole surface and N-type impurities are ion-implanted into the film 12, followed by being patterned. As a result, as shown FIG. 2F, gate electrodes 14A for nMOS and pMOS transistors and an emitter electrode 14B for the BIP transistor are formed. Each of the electrodes 14 is composed of two polysilicon films 11 and 12. Side walls 15 of silicon oxide film are thereafter formed on the respective sides of the gate electrodes 14A and emitter electrode 14B, and the oxide layer 10 is then selectively remove by using the electrodes 14 and the side walls 15 as a mask.

Thereafter, N-type impurities and P-type impurities are ion-implanted by using resist layers (not shown) as a mask, and heat treatment is performed to activate the implanted impurity ions. Consequently, N-type source and drain regions 16, P-type source and drain region 17 and a graft base region 18 are formed, as shown in FIG. 2F. At this time, the impurities contained in the polysilicon electrode 14B are also diffused into the base layer 8 to form an $N^+$-type emitter layer 19. Silicide layers 20 are then formed on the respective surfaces of the regions 16, 17 and 18 and the surfaces of the respective electrodes 14A and 14B to reduce electrical resistance.

Although not shown, interlayer insulating layers and wiring layer are thereafter formed to complete the device.

Thus, the BiCMOS device according to the prior art employs the buried regions 2 and 3 and the epitaxial layer 4. Each of the buried regions 2 and 3 is formed at a high impurity concentration. Accordingly, each of the buried regions 2 and 3 expands in not only vertical direction but also horizontal direction, so that it reaches and contacts with the adjacent buried region. For this reason, large parasitic capacity is produced to thereby lower an operating speed. If the buried regions 2 and 3 would be formed separately from each other in order to eliminate the parasite capacity, the chip area would be inevitably increased and the integration density would be lowered.

During the epitaxial growth, moreover, the so-called out-diffusion occurs in which some of impurities contained each of the buried regions 2 and 3 are diffused outside and the controllability of the out-diffusion is very difficult, as well known in the art. For this reason, the impurity concentration of the epitaxial layer. 4 is largely fractuated from the designed value to thereby change the threshold voltage control of each MOS transistor.

Further, in the prior art, a base layer is formed before a gate oxide film is formed, because contamination from a resist that is a mask for ion implanation to form a base layer exerts a bad influence upon the gate oxide film when the resist is applied directly to the gate oxide film. When oxidation is performed after ion implantation of the base, however, redistribution of a profile and suction of boron into an oxide film are produced, thus a shallow and sharp profile cannot be realized as a result. Since the performance of a BIP depends largely on the base profile, it is difficult to obtain high frequency characteristics by this method.

Against this problem, there is a method of performing base layer formation for a BIP, emitter opening, emitter polysilicon film formation, impurity ion implantation and patterning of emitter electrode after CMOS production process, in short, after patterning of gate electrode. However, there is such a drawback that the production process is further elongated when this technique is adopted. It has been +4 mask against a CMOS in the prior art, but +5 mask in this case.

SUMMARY OF THE INVENTION

It is therefore an object of the present invention to provide a method of manufacturing a semiconductor device in which the above-mentioned problems of the conventional method are eliminated.

A method of manufacturing a semiconductor device having a bipolar transistor according to the present invention comprising the steps of: forming an emitter opening in an insulating film on the semiconductor substrate; depositing a polysilicon film on the insulating film and in the emitter opening portion; implanting impurity ions into the substrate through the polysilicon film to form a collector layer and a base layer; and performing heat treatment, preferably lamp annealing at high temperature for a short length of time for activating impurities of the base layer and the collector layer, and diffusing impurities from the polysilicon into the semiconductor substrate to form an emitter diffused layer.

It is another feature of the present invention to provide a method of manufacturing a semiconductor device having the steps of: separating a first element region for providing a bipolar transistor and a second element region for providing a CMOS on a semiconductor substrate; forming an insulating film which becomes a gate insulating film in the second element region on the first and the second element regions forming an emitter opening in the insulating film of the first element region; depositing a polysilicon film on the insulating film and in the emitter opening portion on the first and the second element regions; selectively implanting impurity ions into the semiconductor substrate of the first element region through the polysilicon film to form a collector layer and a base layer; and performing heat treatment, preferably lamp anneal treatment for activating impurities in the base layer and the collector layer and diffusing impurities into the semiconductor substrate from the polysilicon film to form an emitter diffused layer.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Referring now to FIG. 1, the manufacturing method according to an embodiment of the present invention includes the steps as described below. First, a P-type silicon substrate 1 is prepared which includes an nMOS transistor forming section (a), a pMOS transistor forming section (b) and a BIP transistor section (c), as shown in FIG. 1A. Field oxide films 7 for separating element regions are then selectively formed in the silicon substrate 1 having an impurity concentration of approximately $1 \times 10^{15}$ cm$^{-3}$ by a selective thermal oxidation method (a LOCOS method).

Figure 1A:
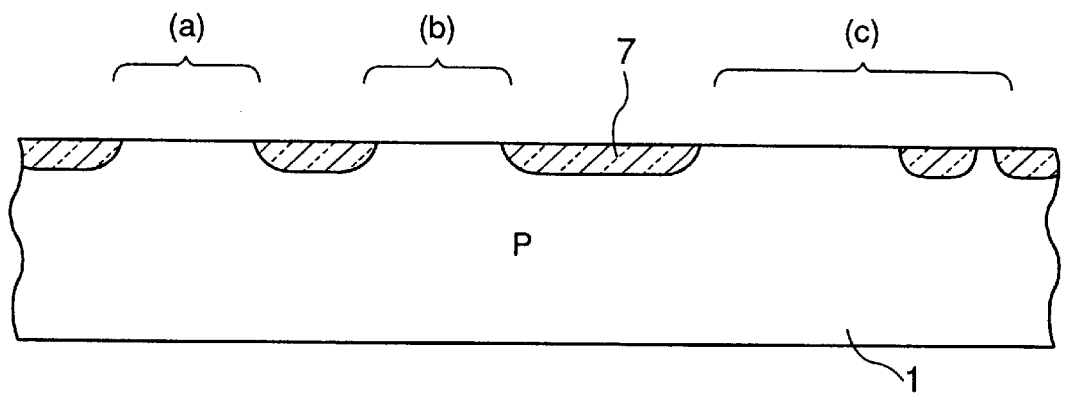
FIG. 1A to FIG. 1G are cross sectional views illustrative of respective steps of manufacturing a semiconductor device according to an embodiment of the present invention.
Figure 1B:
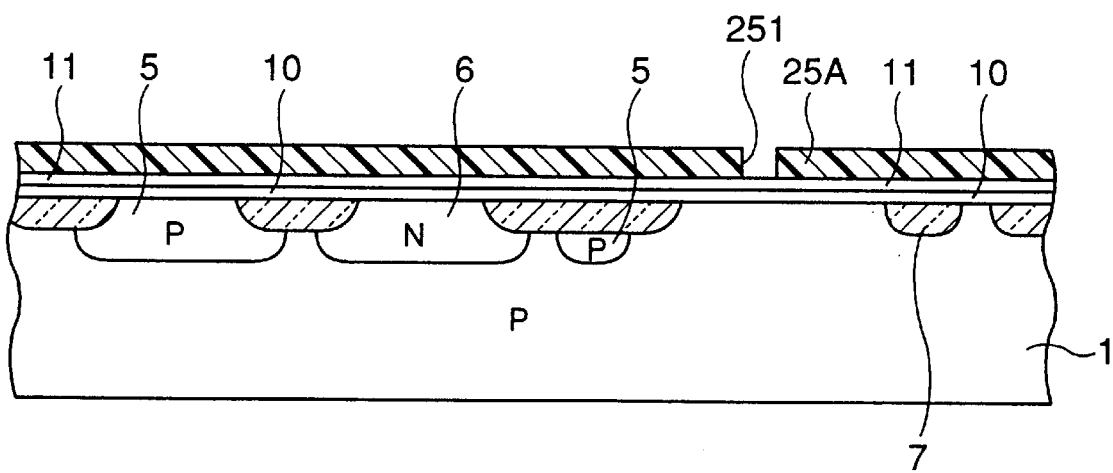

As shown in FIG. 1B, a P-well region 5 and an N-well region 6 are selectively formed in the substrate by an ion-implantation method. Thereafter, a gate oxide film 10 of a thickness of 8 nm and a first polysilicon film 11 of a thickness of approximately 50 nm are deposited in this order on the whole surface of the substrate 1 by thermal oxidation and an LPCVD method, respectively. A photoresist layer 25A is then formed, followed by forming an emitter diffusion window 251 using normal photolithography technique.

Figure 1C:
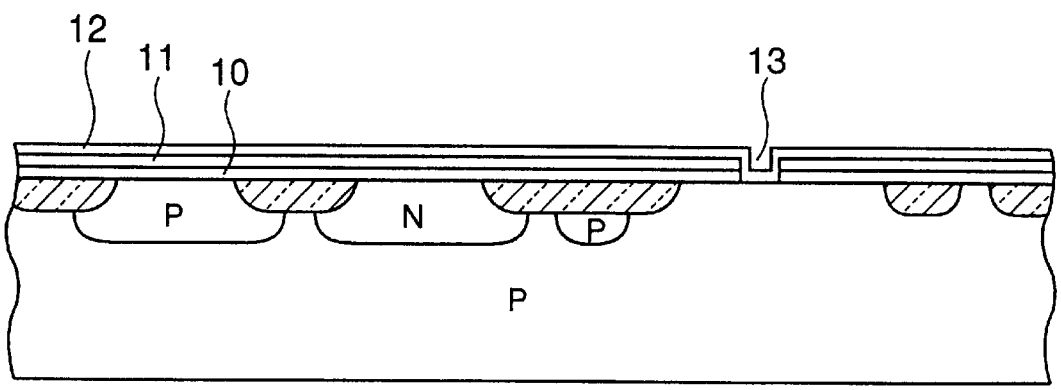

By using the layer 25A as a mask, the first polysilicon film 11 and the gate oxide film 10 are selectively removed to form an emitter opening 13 using a dry etching technique by CHF$_3$+O$_2$ gas, as shown in FIG. 1C. After removing the layer 25A, a second polysilicon film 12 is deposited over the entire surface in a thickness of approximately 100 nm.

Figure 1D:
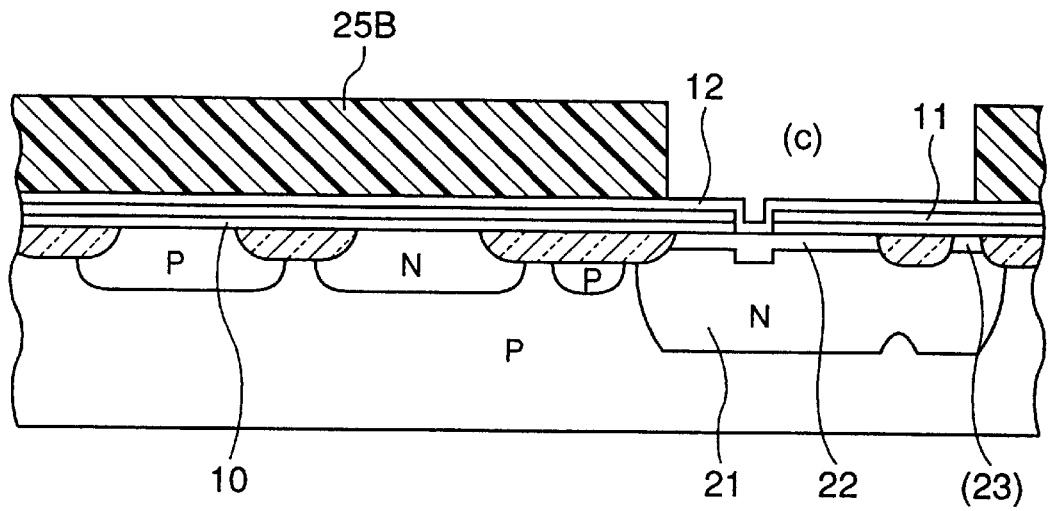

As shown in FIG. 1D, a photo-resist film 25B is formed in a thickness of approximately 3.5 μm and then selectively removed to expose the BIP transistor section (C). Ion implantation is carried out to form a collector layer 21 and a base layer 22 by using the film 25B as a mask at such an energy that allows implanted ions to pass through the polysilicon films 12 and 11 and the silicon oxide film 10. Note that a heat treatment is not performed at this stage, and therefore the respective regions 21 and 22 are in fact not formed yet. The above implantation is performed under conditions wherein phosphorus ions (P$^+$) are implanted with an energy of 800 keV to 1.3 MeV at an impurity dosing amount of $3 \times 10^{13}$ cm$^{-2}$ to $3 \times 10^{14}$ cm$^{-2}$ for a collector and boron ions (B$^+$) are implanted with an energy of 35 keV to 60 keV at an impurity dosing amount of $3 \times 10^{13}$ cm$^{-2}$ to $5 \times 10^{13}$ cm$^{-2}$ for a base.

Next, arsenic ions (As$^+$) are implanted into the second polysilicon film 12 under the conditions with an energy of 30 keV at impurity dosing amount of $5 \times 10^{15}$ cm$^{-2}$. The emitter diffused layer has not been formed at this stage.

Here, compared with the base layer other than the base layer right under the emitter opening the base layer right under the emitter opening is formed deeper because there are not the first polysilicon film and the gate oxide film. At this time impurity ions are also implanted into a region (23) which becomes an N-type collector pullout later.

The depth of the base layer other than the base layer right under the emitter opening has to be set so as to be formed shallower than that of an SD diffused layer and the collector pullout layer formed later. Because, the P-type region remains in the region (23).

Figure 1E:
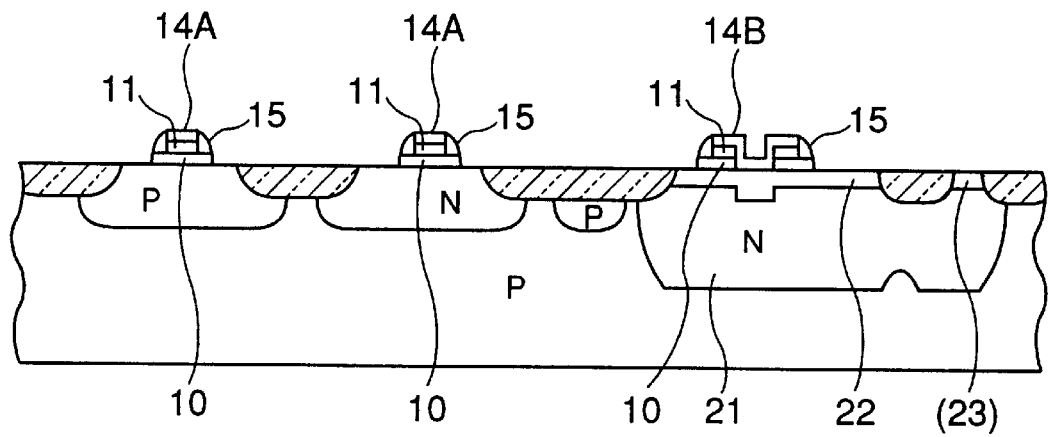

Next, as shown in FIG. 1E, the photoresist film 25B is removed from this state, the second and the first polysilicon films 12 and 11 are selectively etched, and gate electrodes 14A of a CMOS and emitter electrode 14B which becomes an impurity diffusion source for forming an emitter diffused layer of a BIP are formed. Side wall films 15 composed of silicon oxide films are thereafter formed on the sides thereof by a normal method by anisotropic etching. Gate electrodes 14A and a peripheral portion of an emitter electrode 14B having a predetermined thickness are then formed by the first and the second polysilicon films 11 and 12, and a central part of the emitter electrode 14B having a predetermined thickness is formed by the second polysilicon film 12 in the emitter opening. Further, the state of the polysilicon film 12 in the emitter opening which becomes a direct impurity diffusion source exerts an influence upon the formed state of the emitter layer.

Figure 1F:
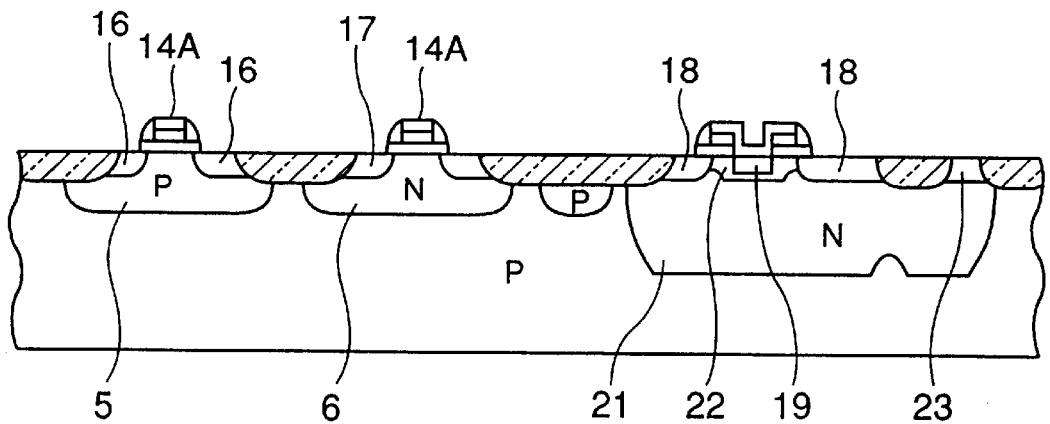

As shown in FIG. 1F, ion implantation for forming an N-type SD (source, drain) diffused layer 16 of an nMOS and an N-type collector pullout layer 23 is performed using a photoresist mask (not shown). Ion implantation for forming a P-type SD (source, drain)diffused layer 17 of a pMOS and a graft base layer 18 of a BIP is performed using a photoresist mask. The graft base layer 18 is formed so as to come close to the emitter electrode 14B.

As a matter of course, the same ion implantation conditions as the CMOS are used as ion implantation conditions of SD. For example, arsenic ions (As$^+$) are implanted with an energy of 60 keV at an impurity dosing amount of $5 \times 10^{15}$ cm$^{-2}$ for an nMOS, and BF$_2^+$ ions are implanted with an energy of 50 keV at an impurity dosing amount of $5 \times 10^{15}$ cm$^{-2}$ for a pMOS.

In case there is no problem when the SD ion implantation conditions of an nMOS are the same as the ion implantation conditions to form the emitter diffused layer at the BIP portion, the above-mentioned ion implantation process into the second polysilicon may be eliminated.

Next, lamp annealing is performed at a high temperature and for a short length of time, thus activating all of the ion implantation layers. These conditions are made the same as the conditions used in a pure CMOS process, such as 1,000° C. and 30 seconds.

By the heat treatment, arsenic ions in the emitter polysilicon electrode 14B are diffused into the substrate, and a diffused layer 19 is formed. Here, it is important to use the same heat treatment conditions as those for the CMOS.

Because, if these conditions are changed, features of the BIP are deviated from those of the CMOS, thus making it impossible to share the design data. In other words, ion implantation conditions related to BIP have to be determined so that desired BIP features may be obtained under these conditions.

Figure 1G:
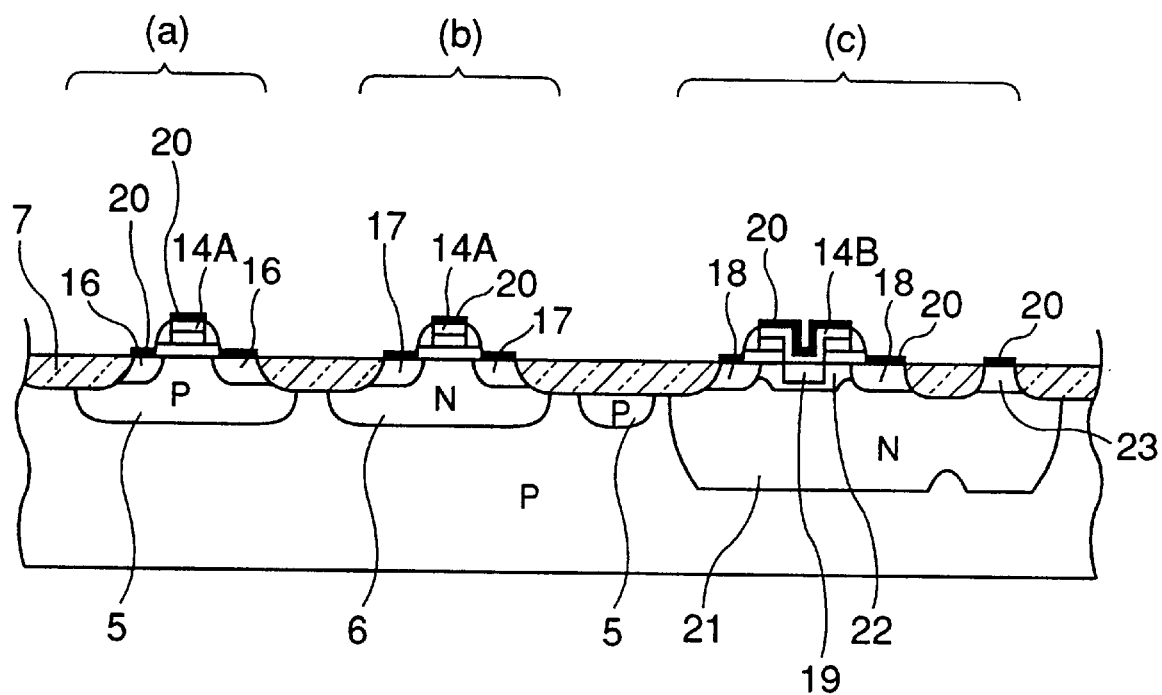
Figure 2A:
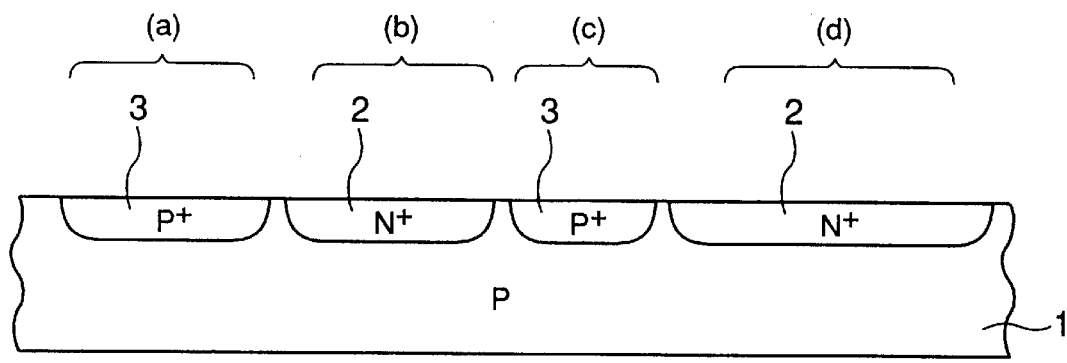
FIG. 2A to FIG. 2F are cross sectional views illustrative of respective steps of manufacturing a semiconductor device according to a prior art.
Figure 2B:
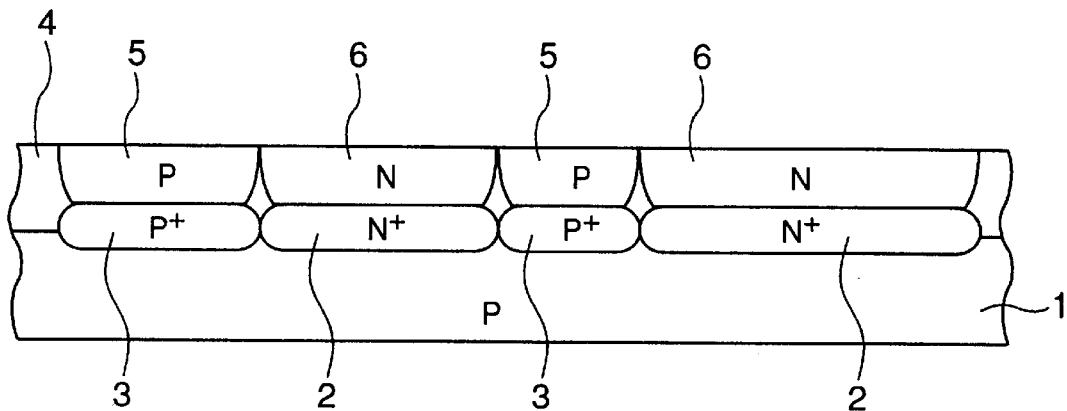
Figure 2C:
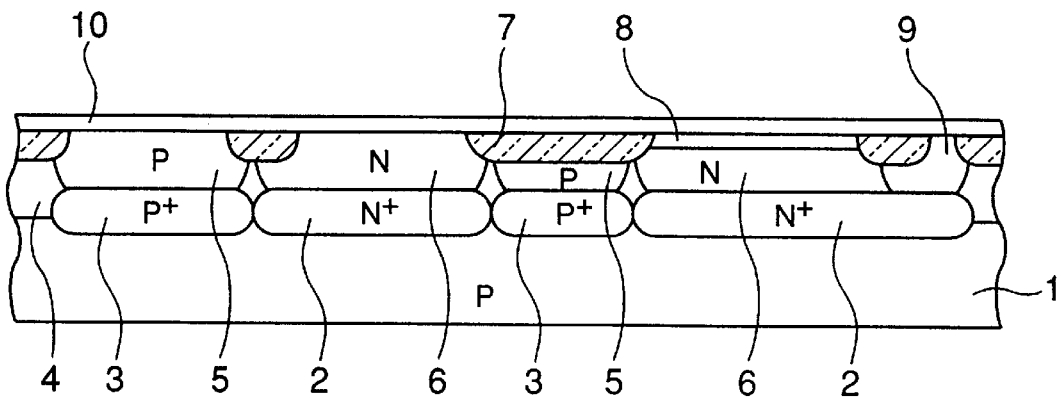
Figure 2D:
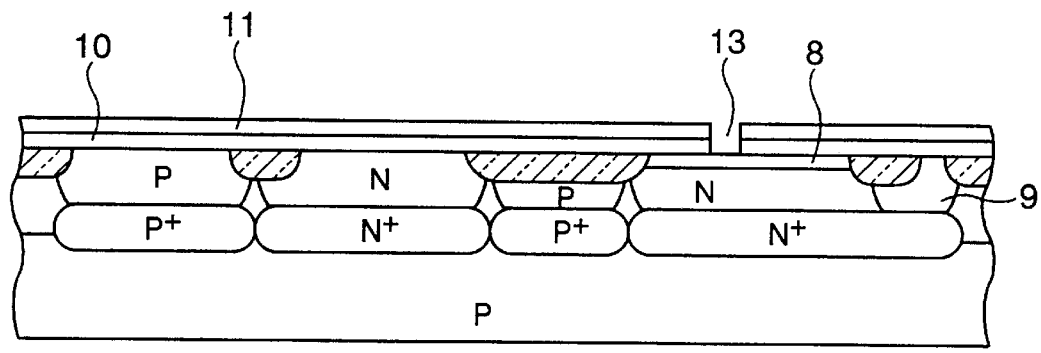
Figure 2E:
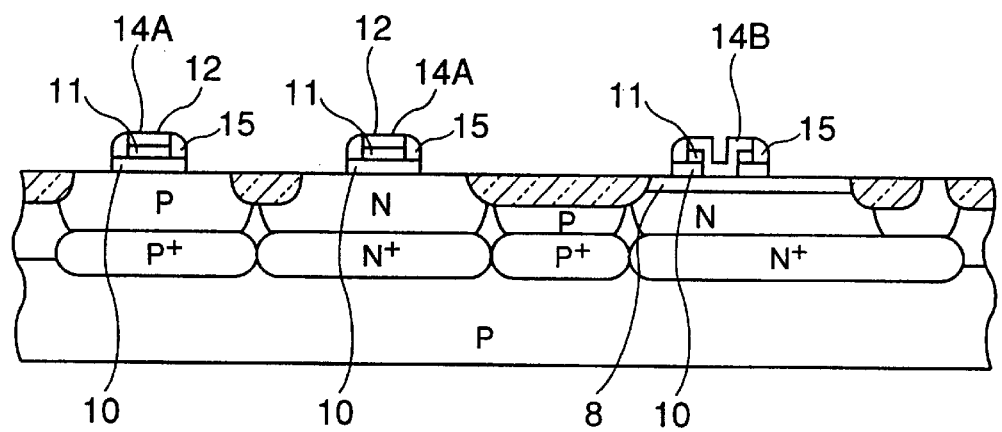
Figure 2F:
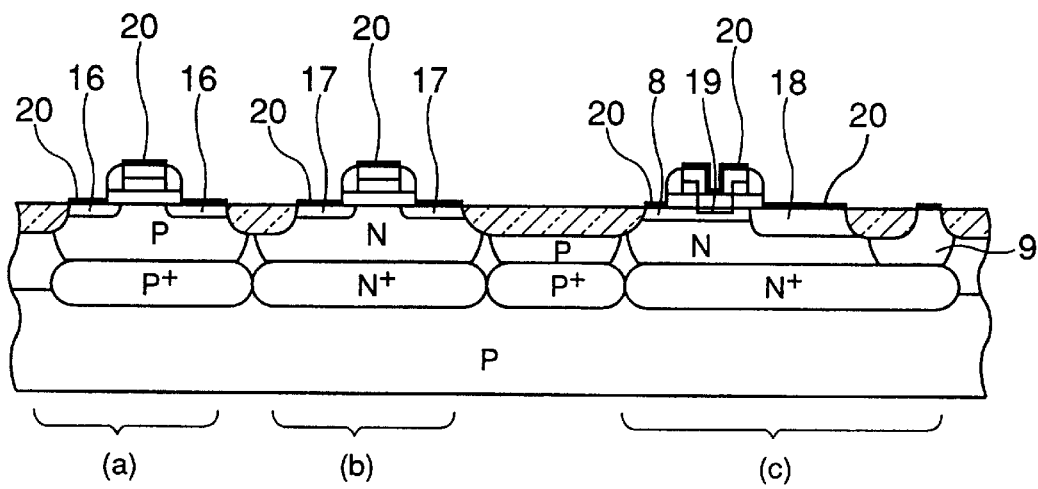

Finally, as shown in FIG. 1G, silicides 20 are formed on the diffused layer surfaces and the electrode surfaces. Thereafter, an interlevel insulator, an electrode wiring or the like are formed, thus a semiconductor wafer which is a foundation for obtaining a semiconductor device is completed.

As it is apparent from the above description, it is possible to realize a BICMOS capable of sharing design assets of the CMOS by adding only two sheets of masks when the present invention is applied. Namely, in the prior art, it has been required to add five sheets of masks, i.e., for N$^+$ buried PR, for P$^+$ buried PR, for collector pullout PR, for base PR and for emitter opening PR in a BICMOS as compared with the CMOS. In the present invention, however, a BICMOS is obtainable by adding only two sheets of masks for emitter opening PR (FIG. 1B) and for BIP portion PR (FIG. 1D) without using the method that the base layer is formed before the gate oxide film is formed.

Here, as another advantage of the present invention, it is desired to emphasize that the method of present invention is strong against emitter-to-base junction breakdown in BIP portion at the time of forming silicide. Since the silicide reaction to polysilicon is not uniform, but advances locally, the probability that silicide of a spike shape penetrates becomes very high in an emitter where polysilicon contacts with the substrate directly, and a junction breakdown is generated as a result. Since junction is formed shallow in order to realize high performance BIP in particular, this phenomenon becomes very conspicuous.

This silicide reaction depends largely on the concentration of arsenic which is a dopant of the emitter, and the reaction is restrained as the concentration gets higher. Accordingly, as the arsenic concentration in the emitter electrode gets higher, the emitter-to-base junction is stronger against breakdown.

On the other hand, since the silicide reaction does not advance, the silicide resistance gets higher. Although there is no problem for the emitter, it becomes a factor of dropping the performance for the gate electrodes. Therefore, the thicker silicide film thickness of the gate itself is better. In other words, the optimum solution cannot be obtained unless the impurity doping quantities of the gate electrodes and the emitter electrode are set individually. This cannot be realized in the prior art, but can be realized for the first time according to the present invention.

This problem can be solved when the gate electrodes and the emitter electrode are formed individually, but five sheets of additional masks become necessary as described previously, thus causing considerable cost increase.

As described in detail above, according to a manufacturing method of the present invention, a BICMOS having exactly the same features as a pure CMOS can be realized, thus enabling it to realize the promotion of design efficiency. Further, a BICMOS can be realized without using an epitaxial technique which is costly and difficult to control production, with only two sheets of additional masks. Therefore, the effect thereof is immeasurable.

Further, it is a matter of course that the present invention is applicable not only to a BICMOS, but also to a manufacturing method of a BIP, i.e., a manufacturing method of a BIP which is not incorporated with a CMOS without any problem.

I claim:

1. A method of manufacturing a semiconductor device, comprising the steps of:

providing an element region for forming a bipolar transistor on a semiconductor substrate;

forming an insulating film on said semiconductor substrate;

forming an emitter opening in said insulating film on said element region;

forming a polysilicon film on said insulating film and in said emitter opening;

forming a mask layer which exposes said polysilicon film on said element region;

ion-implanting impurities of a first conductivity type into said semiconductor substrate by using said mask layer as a mask to form a collector layer of said bipolar transistor;

ion-implanting impurities of a second conductivity type into said semiconductor substrate by using said mask layer as a mask to form a base layer of said bipolar transistor in an upper portion of said collector layer;

ion-implanting impurities of said first conductivity type into said polysilicon film;

selectively ion-implanting impurities of said first conductivity type into a part of said base layer to form a collector pullout layer, said collector pullout layer contacting said collector layer and concentration of said collector pullout layer being higher than that of said collector layer; and performing heat treatment for activating the impurities of said base layer and said collector layer and diffusing said impurities into said semiconductor substrate from said polysilicon film to form an emitter diffused layer.

2. A method of manufacturing a semiconductor device according to claim 1, wherein said heat treatment is lamp anneal processing.

3. The method of manufacturing the semiconductor device according to claim 1, wherein said step of forming a base layer provides that a depth of said base layer other than said base layer immediately under said emitter opening is shallower than that of said collector pullout layer.

* * * * *